United States Patent [19]

Detro et al.

[11] Patent Number: 4,765,741

[45] Date of Patent: Aug. 23, 1988

[54] WAVELENGTH TRACKING COMPENSATOR FOR AN INTERFEROMETER

[75] Inventors: Scott M. Detro, Sunnyvale; Alan H. Field, San Jose, both of Calif.

[73] Assignee: Hewlett-Packard Company, Palo Alto, Calif.

[21] Appl. No.: 28,527

[22] Filed: Mar. 20, 1987

[51] Int. Cl.$^4$ ............................................. G01B 9/02
[52] U.S. Cl. ................................................. 356/358
[58] Field of Search ............... 356/345, 358; 248/181, 248/481, 482, 483, 484, 663

[56] References Cited

U.S. PATENT DOCUMENTS 3,519,236 7/1970 Schmidt et al. ................... 248/181
4,215,938 8/1980 Farrand et al. .

Primary Examiner—Davis L. Willis
Assistant Examiner—Matthew W. Koren
Attorney, Agent, or Firm—James M. Williams

[57] ABSTRACT

A wavelength tracking compensator for a laser interferometer measurement system comprises a stable physical standard optical cavity and a double path, differential interferometer mounted on a baseplate. The interferometer monitors the apparent changes in the cavity's length caused by actual changes in the index of refraction of the surrounding air. The cavity is supported with a temperature compensated mount that utilizes the principle of differential thermal expansion of two different metals to create a mount which exactly matches the coefficient of expansion of the cavity material. A semi-kinematic mount supports the double path, differential interferometer and allows the interferometer to be accurately aligned to the cavity with three rotational degrees of freedom to prevent any cosine error in the cavity's optical path length measurement, to prevent polarization leakage, and to maximize optical power at the receiver. A phase measurement system interpolates between interference fringes to extend measurement resolution and provides absolute phase information relative to the fringes so that the measurement system can prevent measurement uncertainty caused by a beam interruption and recover from an interruption without re-initialization.

6 Claims, 5 Drawing Sheets

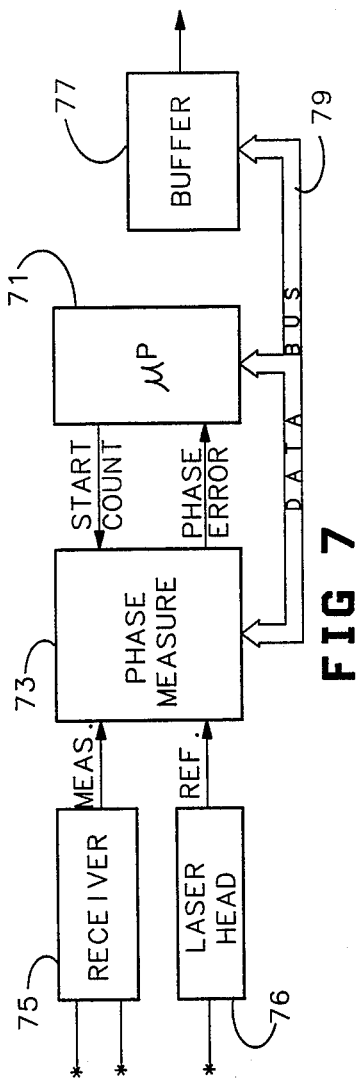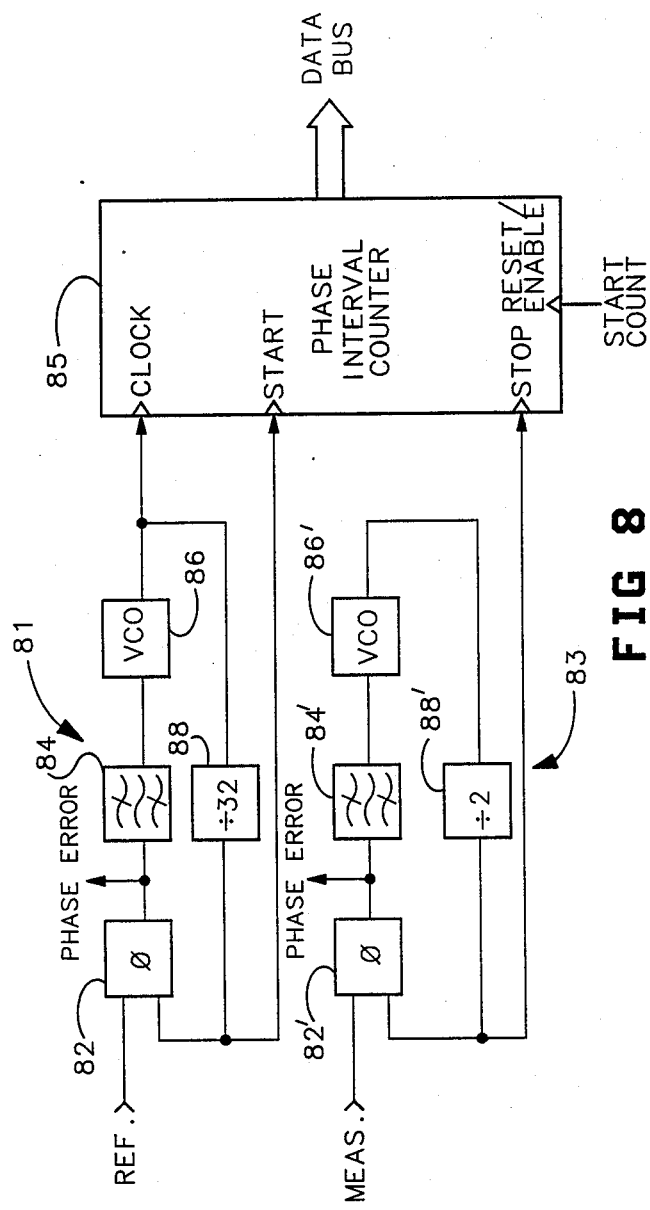

WAVELENGTH TRACKING COMPENSATOR FOR AN INTERFEROMETER

BACKGROUND AND SUMMARY OF THE INVENTION

The invention relates to compensation for wavelength changes in laser interferometer measurement systems, and in particular to a wavelength tracking compensator with an ultra-low thermal expansion optical cavity.

Laser interferometers measure linear displacements to sub-micron accuracies for measurement and control of precision equipment, such as integrated circuit manufacturing, disc-drive manufacturing and precision measurement and machining equipment.

Laser interferometers use the wavelength of the laser light as a standard for making distance measurements. Any changes in the measurement environment that affect the apparent wavelength of the laser light can seriously degrade measurement accuracy. Thus, changes in atmospheric conditions such as pressure, temperature, composition and humidity, which change the optical index of the medium through which the laser beam passes, can introduce errors into the measurement.

Many precision positioning and measuring machines have a built in temperature control, but no control for pressure or other atmospheric factors. The atmospheric factors can be eliminated by providing a vacuum environment for the laser system, but this is very expensive and is usually impractical in manufacturing applications.

It is possible to directly measure the individual atmospheric factors, but this is also expensive, requiring multiple sensors. This method also has inherent response delay caused by the time constants of the sensors, and requires calculation of the cumulative effects of the changes on the laser light wavelength.

One attempt to correct for wavelength changes in precision machine tool applications was a compensator comprised of a steel cavity mounted on a plane mirror interferometer optic. The thermal expansion of the cavity approximately matched the thermal expansion of the machine tool on which it was mounted. However, with a steel cavity the wavelength compensation is only accurate for use on steel equipment with approximately the same thermal expansion coefficient; furthermore the unit must be used in a temperature controlled environment to insure that the steel cavity is at the same temperature as the machine tool it is monitoring. These problems limit the performance of the instrument to a relative standard and limit the application of this type of instrument primarily to the machine tool industry.

The wavelength tracking compensator of the invention is a device for tracking changes in the wavelength of the laser light source of an interferometer system by monitoring changes in the apparent length of a stable physical standard measured by the system. This standard is an optical cavity formed by two plane mirrors optically contacted to the ends of a rigid, stable tube that is open to the surrounding air. A double path, differential interferometer is used to monitor the apparent changes in the cavity's length caused by actual changes in the index of refraction of the surrounding air.

For the wavelength tracking compensator, it would be ideal to use an optical cavity constructed of material having a very low thermal expansion coefficient. The problem arises in mounting the cavity on the machine or instrument to be monitored, which will have a quite different thermal expansion coefficient.

The optical cavity must be supported by a structure which applies a constant supporting force to the cavity regardless of changes in the ambient temperature and pressure. Any change in the external force due to changes in ambient temperature or pressure would change the optical length of the cavity or distort the optical figure of the mirrored surfaces at either end of the cavity. The support structure must maintain a radial clearance of very small variation to prevent cavity tilt which would result in cosine error. The support structure must prevent roll or translation of the cavity with respect to the interferometer to maintain optical alignment between the cavity and the laser beam.

Conventional support structures could be adjusted to work at one temperature. As the temperature deviated from the "set point" temperature, the cavity would either become loose in its mounts causing excessive cosine error or tight in its mounts causing a length change in the cavity and/or distortion of the mirror's optical figure.

There are several difficulties in mounting and aligning the interferometer to achieve optimal performance. The support structure must provide three rotational degrees of freedom (roll, pitch and yaw).

The double path, differential interferometer must be very accurately aligned with the optical cavity to prevent any cosine error in the cavity's optical path length measurement, to prevent polarization leakage, and to maximize optical power at the receiver. The mount for the interferometer must provide three rotational degrees of freedom (roll, pitch and yaw) to achieve proper alignment. The mount must provide roll adjustment to eliminate optical leakage of the vertical polarization of light from the laser head into the horizontal polarization and vice versa. The mount must provide pitch and yaw adjustments to allow the incident beams to be adjusted so they are exactly perpendicular to the cavity's mirrored surfaces to prevent cosine error and to maximize optical power at the receiver.

Previous interferometer mounts provided discrete pitch and yaw adjustments with no roll capability at all. These mounts typically had two machined parts (a pitch plate and a yaw plate) and required four screws and four washers to mount and adjust the assembly. The pitch and yaw motions would have to be adjusted one at a time and often the act of clamping disturbed the aligned position, forcing the user to realign the interferometer repeatedly until satisfactory alignment was achieved. The roll angle of the mount, not being adjustable, was at the mercy of the machining tolerances of the individual components providing the pitch and yaw adjustments. Accumulated tolerance build-up could result in a considerable amount of roll axis error, degrading system performance.

To measure the wavelength change, the differential interferometer uses two sets of beams; one reflected by the front surface of the stable cavity and the other reflected by the rear surface of the cavity. These two beam components are mixed and the difference in their frequencies is used as the measure frequency. The measure frequency is compared to a reference frequency generated by the laser head. Any phase change between the two frequencies is due to wavelength change of the laser beam through the cavity.

Conventional laser measurement systems measure the cumulative phase difference between the reference and measure frequencies, starting at some arbitrary point in time, typically when the system is initialized. If one of the beams is blocked, or the signal for one of the beams is lost, even momentarily, the measurement must be re-initialized because the phase information during the interruption cannot be reconstructed. This causes difficulties in making measurements that remain accurate over long time periods.

An object of the invention is to provide a system for accurately measuring the changes in the wavelength of the laser light and compensating the laser interferometer measurement for those changes. The system eliminates the compensation inherent in other methods which involve multiple sensors.

Another object of the invention is to provide a temperature compensated mount for an optical cavity made of an ultra-low thermal expansion material, so the wavelength tracking compensator can be used with great accuracy in a non-temperature controlled environment. This greatly increases the range of applications and the performance of the compensator while reducing the requirements on controlling the environment.

Another object of the invention is to provide a semi-kinematic mount for optical components capable of simultaneous adjustment in three degrees of rotational freedom (roll, pitch and yaw), and securely held in proper alignment during clamping.

Another object of the invention is to provide a phase measurement system for an interferometer that can recover from measurement interruptions without re-initialization and that has extended phase measurement resolution.

The preferred embodiment of the invention comprises a stable physical standard optical cavity and a double path, differential interferometer mounted on a baseplate. The interferometer monitors the apparent changes in the cavity's length caused by actual changes in the index of refraction of the surrounding air. The cavity is supported with a temperature compensated mount that utilizes the principle of differential thermal expansion of two different metals to create a mount which exactly matches the coefficient of expansion of the cavity material. A semi-kinematic mount supports the double path, differential interferometer and allows the interferometer to be accurately aligned to the cavity with three rotational degrees of freedom to prevent any cosine error in the cavity's optical path length measurement, to prevent polarization leakage, and to maximize optical power at the receiver. A phase measurement system interpolates between interference fringes to extend measurement resolution and provides absolute phase information relative to the fringes so that the measurement system can prevent measurement uncertainty caused by a beam interruption and recover from an interruption without reinitialization.

BRIEF DESCRIPTION OF THE DRAWINGS

FIG. 7 shows the schematic block diagram of the phase measurement system of the preferred embodiment.

FIG. 8 shows a more detailed schematic block diagram of the phase measurement module 73.

DETAILED DESCRIPTION OF THE INVENTION

Figure 1:
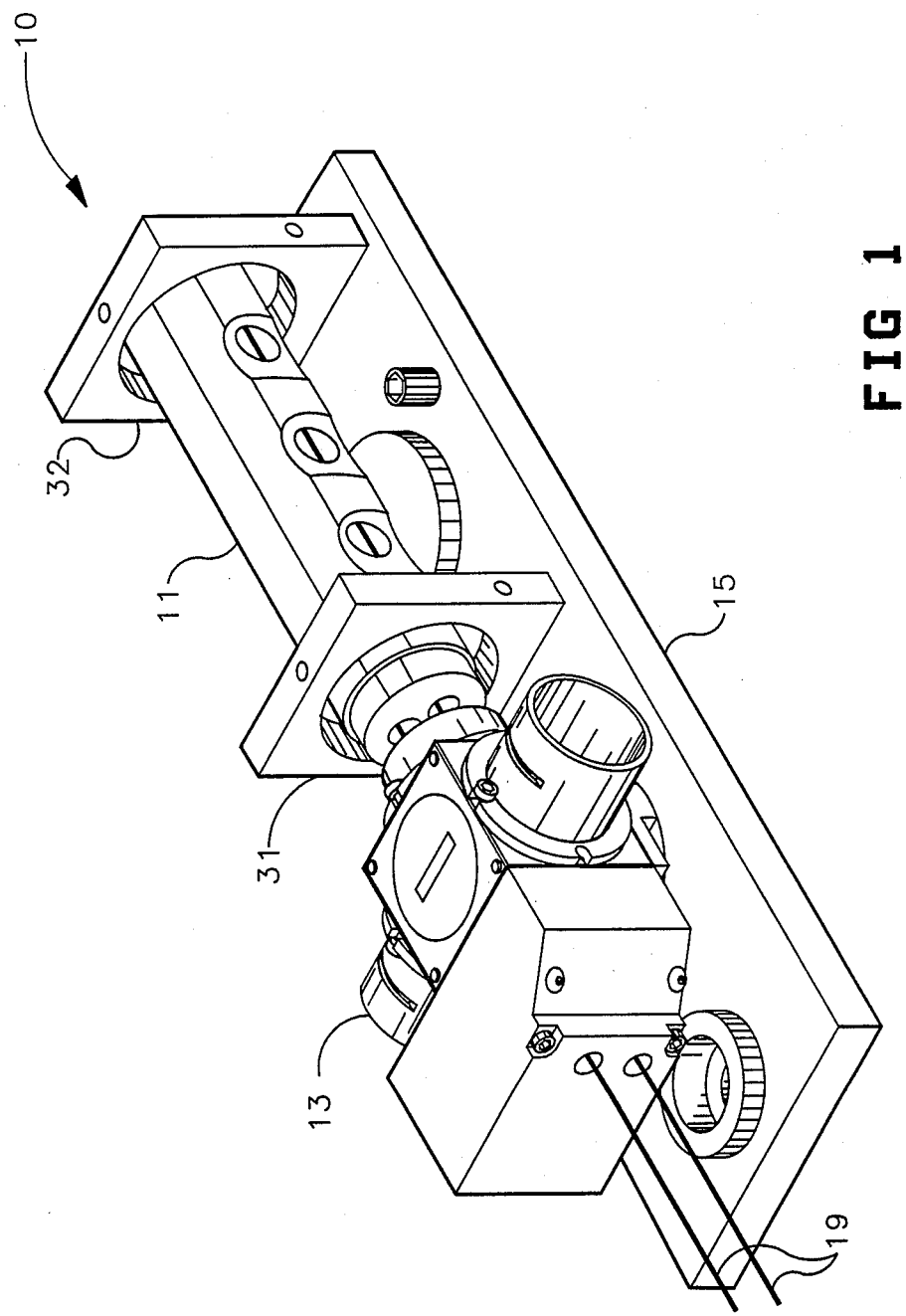
FIG. 1 shows the wavelength tracking compensator of the preferred embodiment of the invention.

The preferred embodiment of the compensator 10 of the invention, shown in FIG. 1, comprises a stable physical standard optical cavity 11 and a double path, differential interferometer 13 mounted on a baseplate 15. The interferometer 13 monitors the apparent changes in the cavity's length caused by actual changes in the index of refraction of the surrounding air. A laser beam 19 from a laser source follows a path through the interferometer 13 and the optical cavity 11, to a detector, not shown. The optical cavity 11 is supported with a temperature compensated mount including support plates 31 and 32 that utilizes the differential thermal expansion of two different metals to create a mount which exactly matches the coefficient of expansion of the cavity material. A semi-kinematic mount, not shown in FIG. 1, supports the double path, differential interferometer 13 and allows the interferometer to be accurately aligned to the cavity 11.

Figure 2:
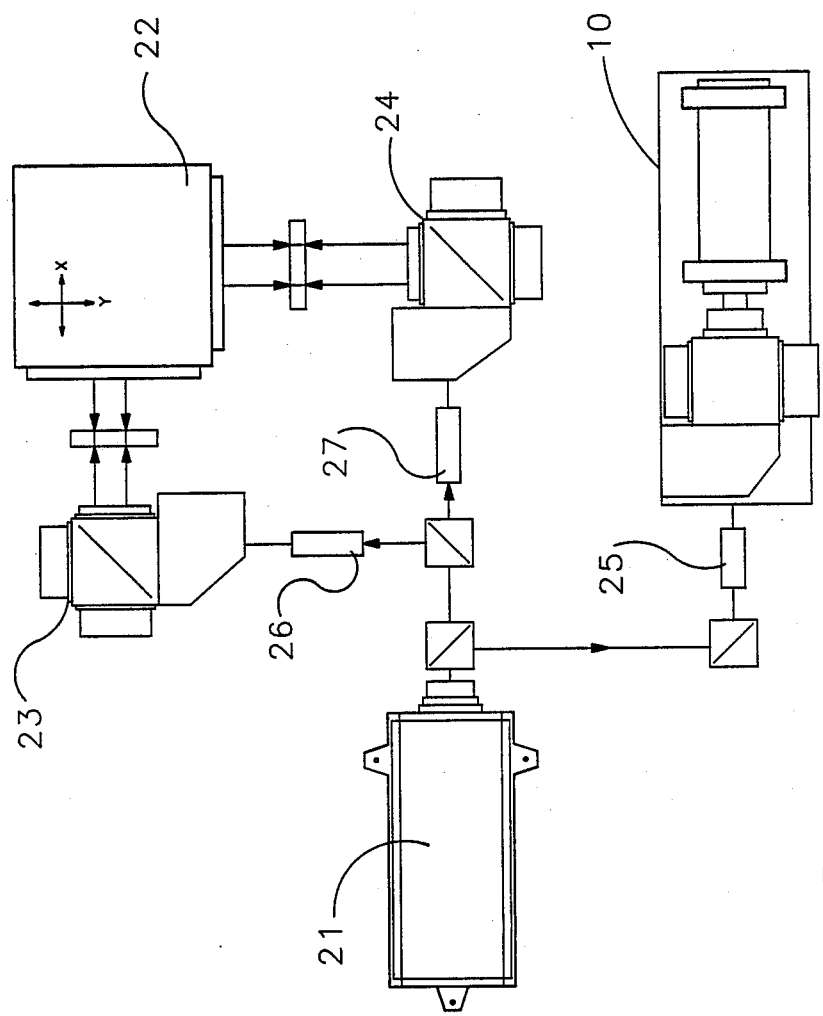
FIG. 2 shows a typical laser interferometer measurement system incorporating the wavelength tracking compensator of the preferred embodiment of the invention.

FIG. 2 shows the application of the compensator of the invention in a typical laser interferometer measurement system, set up to monitor the x-axis and y-axis movements of a stage. One such system is the Hewlett-Packard model 5527A laser position transducer system. Two double path, differential interferometers 23, 24 measure the movements of the stage 22, using a laser beam from laser source 21. A portion of the laser beam is directed to the wavelength tracking compensator 10, which monitors changes in the wavelength of the laser light. Compensator 10 is located in the same atmospheric environment as the interferometers 23 and 24 and the stage 22, so the wavelength changes of the laser beam passing through the compensator are the same as those in the beams used to measure the position of the stage.

Temperature Compensated Cavity Mount

The temperature compensated cavity mount utilizes the principle of differential thermal expansion to create a support constructed from two different metals, so that the coefficient of expansion of the radial support points around the diameter of the optical cavity exactly match the coefficient of expansion of the cavity material.

Figure 3:
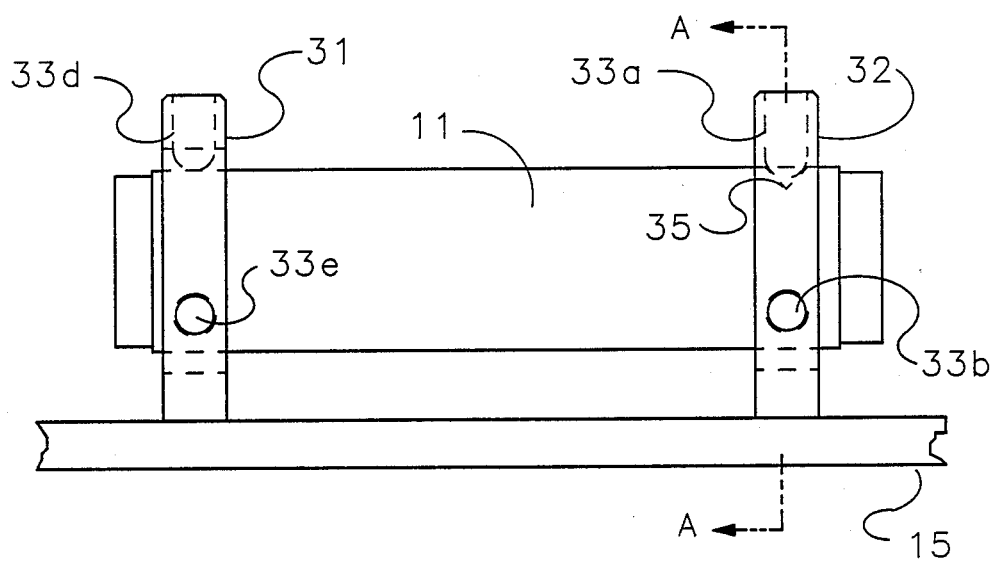
FIG. 3 shows the details of the temperature compensated mount for the optical cavity.
Figure 4:
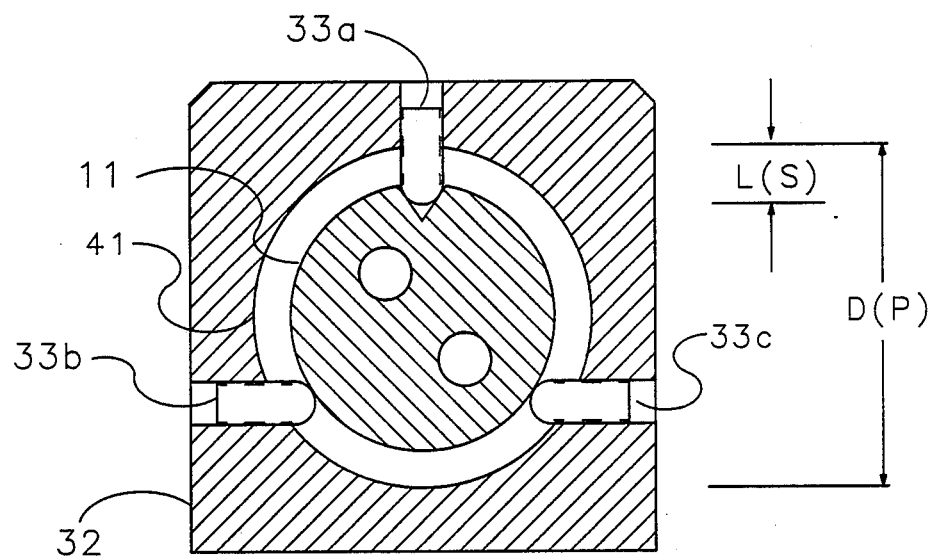
FIG. 4 shows a cross sectional view of FIG. 3 through plane AA.

The construction of the temperature compensated cavity mount is shown in FIGS. 3 and 4. FIG. 3 shows an elevation view of the cavity mount, and FIG. 4 shows a cross sectional view through FIG. 3 at plane AA.

The optical cavity 11 is held by two upright support plates 31 and 32 with three spherical point set screws 33a–33f in each upright which contact the cavity at 120 degree intervals. A baseplate 15 provides mechanical support and maintains the proper spacing between the upright support plates 31 and 32. To prevent axial and rotational motion of the cavity relative to the baseplate, one of the six set screws 33a in support plate 32 is positioned in a 90 degree countersink 35 located on the diameter of the cavity. Thus, the cavity is restrained at the end nearest to interferometer 13 by set screw 33a. To avoid axial stress on the cavity as the baseplate 15 expands and contracts, there is no countersink for any of the set screws 33d–33f in support plate 31 at the other end of the cavity. Thus, these set screws can slide along the surface of the cavity without restraining the axial motion of the cavity relative to the baseplate.

The cavity 11 is constructed of an ultra-low expansion material, such as Zerodur, manufactured by Schott. The ends of the cavity are machined flat and parallel. Mirrored windows 42 and 43 are optically contacted to the ends of the cavity.

Two of the four double pass differential interferometer laser beams are reflected by the mirrored surface of the window 42 closest to the interferometer 13. The other two laser beams pass through holes 44 and 45 machined parallel to the axis of the cavity and are reflected by the mirrored surface of the window 43 farthest from the interferometer.

Three holes 46, 47 and 48 are machined through the side of the cavity 11 perpendicular to the axial holes 44 and 45 to allow the surrounding atmosphere to pass freely through the cavity with as little obstruction as possible. This insures that the atmospheric changes affect the laser beams between the mirrored surfaces, and that the same atmospheric conditions prevail in the wavelength tracking compensator as in the measurement axes which are being compensated.

To provide a temperature compensated radial support structure for the cavity 11, two materials of different thermal expansion coefficients are used which work in opposition to each other. The upright support plates 31 and 32 are made of a relatively low thermal expansion, such as Invar. The relevant dimension is the relatively large diameter D(P) of the mounting hole 41, see FIG. 4. The spherical point set screws 33a–33e are made of a relatively high thermal expansion material, such as steel. The relevant dimension for the screws is the short length L(S) from the edge of the mounting hole 41 to the surface of the cavity 11.

An equation can be written to specify the length and expansion coefficient requirements of the cavity 11, the screws 33a–33f and the support plates 31 and 32 to ensure that the coefficient of expansion of the support points around the diameter of the optical cavity exactly matches the coefficient of expansion of the cavity material:

$$TEC(C)*R(C) + TEC(S)*L(S) = TEC(P)*R(P) \quad (1)$$

ps where:
TEC(C) is the thermal expansion coefficient of the cavity;
TEC(P) is the thermal expansion coefficient of the upright plate;
TEC(S) is the thermal expansion coefficient of the screw;
R(C) is the radius of the cavity;
R(P) is the radius of the mounting hole in the upright plate, R(P)=D(P)/2; and
L(S) is the length of the spherical point set screw between the cavity and the hole in the upright plate, i.e. R(P)−R(C)=L(S).

Satisfying the above equation (1) with the proper thermal expansion coefficients and lengths of the individual parts insures a thermally compensated support structure which matches the radial thermal expansion of the cavity exactly. The equation can be solved by substituting for L(S), solving the equation for either the radius of the cavity 11 or the radius of the mounting hole 41 in the support plate and using the other variable as the independent variable.

This temperature compensated cavity mount will maintain a radial clearance between 0.0001" and 0.0004" over a temperature range of −55° C. to +75° C. when initially adjusted to 0.0002" clearance at 20° C. This prevents potentially significant cosine errors due to tilt, eliminates any change in force supporting the cavity which in turn prevents any cavity length changes or mirror distortion. It also provides a means of support for the cavity without allowing roll or translation of the cavity with respect to the differential interferometer's laser beam.

Semi-kinematic Interferometer Mount

The optical mount for the interferometer 13 is a single machined part that can be bolted to the interferometer optic and can be secured in a cylindrical counterbore in the supporting baseplate with a standard screw. The machining cost of the one piece mount is about one fourth the cost of a conventional multi-part mount, and it takes less time to assemble and adjust the mount due to the semi-kinematic design of the assembly.

Figure 5:
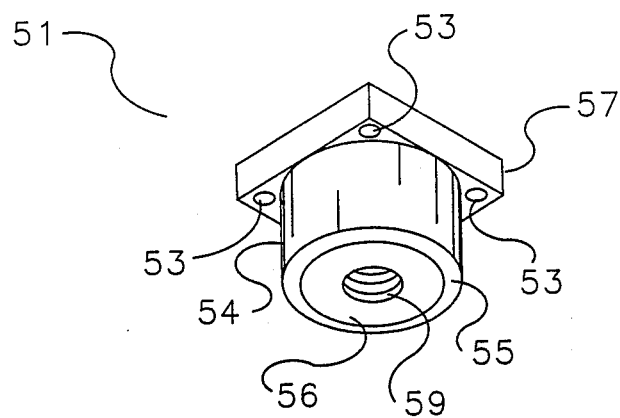
FIGS. 5 and 6 show details of the semi-kinematic mount for the interferometer optic.
Figure 6:
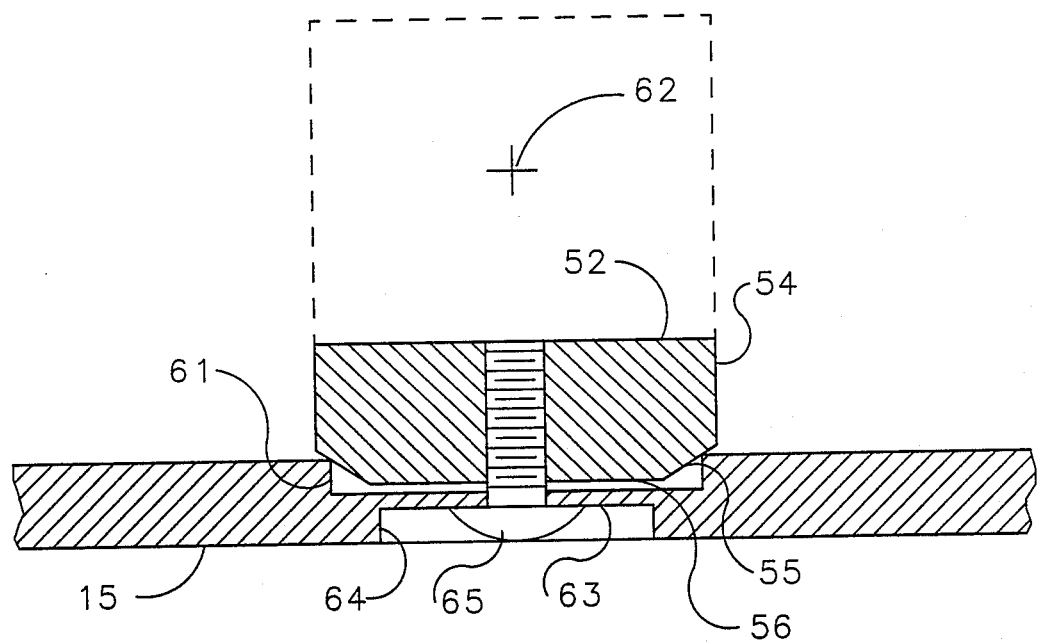

The details of the mount and the mount assembly with the baseplate are shown in FIGS. 5 and 6. The mount platform 51 has a flange 57 with a flat top surface 52 with four holes 53 to attach the interferometer. The bottom of the mount has a cylindrical neck 54 with a convex, spherical surface 55 machined on its lower periphery. The bottom surface 56 of the neck 54 is machined flat, parallel to the top surface 52. The mount has a threaded hole 59 through the center to receive the locking screw 65.

The spherical surface 55 of the mount rests on the top edge of cylindrical counterbore 61 in the top of baseplate 15. A second counterbore 64 in the bottom of baseplate 15 forms an annular web 63 at the bottom of counterbore 61. The locking screw 65 fits through a hole in the center of web 63 into threaded hole 59 in mount platform 51.

The hole in the web is larger in diameter than the mounting screw 65, to allow the mount to be adjusted over the required range of motion, +/−1 degree, in the pitch, roll and yaw axes.

The radial center point of the spherical surface 55 on the mount is coincident with the optical axis 62 of the interferometer optic when the interferometer optic is attached to the mount. This prevents any beam translation at the center of the optic as it is pitched, rolled or yawed and thus eliminates any need for corrective translation adjustments. The fit of the spherical surface 55 with the edge of the cylindrical counterbore 61 maintains a uniform ring of contact between the mount platform 51 and the baseplate 15 and provides a smooth adjustment over the entire range of motion of the mount.

The web 63 at the bottom of the counterbore 61 is thin enough to allow the web to deform until it comes in contact with the bottom surface 56 of the mount when the locking screw 65 is tightened. This assures a tightly bolted joint which will not loosen when subjected to vibration or shock loads.

As the locking screw is tightened, the friction between the mount and the baseplate increases faster than the twisting torque on the mount. This assures that clamping the mount by tightening the locking screw will not disturb the alignment of the interferometer.

Phase Measurement

The phase measurement system measures the accumulated phase change between the signal from the stable cavity and a reference signal from the laser head. This phase change represents the optical phase change caused by the change in the wavelength of the laser light. Unlike conventional systems, the phase measurement system of the invention can measure the absolute phase difference in fractions of a fringe, and recover accurate phase change information after a measurement interruption.

The schematic block diagram of the phase measurement system of the preferred embodiment is shown in FIG. 7. Based on phase measurements from phase measurement module 73, microprocessor 71 calculates the accumulated phase change that has occurred since the last initialization. Microprocessor 71 commands the phase measurement module 73 to sample the phase difference at 1 milliseconds interval. Phase measurement module 73 compares the phase of a measure signal from receiver 75 with the phase of a reference signal from laser head 76. Receiver 75 mixes the beam reflected by the front surface of the stable cavity and the beam reflected by the rear surface of the cavity to produce a difference signal used as the measure signal. Phase measurement module 73 sends the resulting phase difference measurement to microprocessor 71 via data bus 79. Microprocessor 71 calculates the updated wavelength change, based on the accumulated phase difference, and sends it to output buffer 77 via bus 79, so the updated wavelength change data is available to the laser measurement system for compensating the system's output.

FIG. 8 shows a more detailed schematic block diagram of the phase measurement module 73. The reference signal is applied to a phase discriminator 82, in reference phase locked loop 81, which also includes a filter 84, a voltage controlled oscillator (VCO) 86, and a divider 88 connected in a loop. The divider 88 divides the output of the VCO by 32 before applying it to the phase discriminator to complete the loop. The output of the VCO 86, which is the reference signal frequency multiplied by 32, is applied to the clock input of a phase interval counter 85. The result is a clock frequency at 32 times the reference signal frequency. Counter 85 is a 5-bit counter with start, stop, enable and clear controls. The output of the divider 88, which is locked to the reference frequency, is applied to the start input of counter 85. The measure signal is applied to a phase discriminator 82', in measure phase locked loop 83, which is similar to the reference loop 81, and includes a filter 84', a voltage controlled oscillator (VCO) 86', and a divider 88' connected in a loop. The divider 88' divides the output of the VCO by 2 before applying it to the phase discriminator to complete the loop. The output of the divider 88', which is locked to the measure frequency, is applied to the stop input of counter 85.

In operation, when counter 85 is enabled by the start count command from microprocessor 71, it starts counting clock pulses at the next rising edge of the filtered reference signal from loop 81. The counter 85 stops at the next rising edge of the filtered measure signal from loop 83. The number of clock pulses counted, N, represents the phase difference between the reference signal and the measure signal. The absolute phase difference between the signals is N/32 of a cycle or fringe, N*11.25°.

Use of the reference signal phase locked loop 81 provides two functions: a phase based clock rather than a time based clock and reference signal error detection. Use of the measure signal phase locked loop 83 provides two functions: measure signal error detection and common mode rejection of phase information in the two signals because the start and stop signals applied to the counter 85 are generated by dynamically equivalent circuits.

Microprocessor 71 commands the phase measurement module 73 to make a phase measurement at 1 millisecond intervals. With each new phase difference measurement, microprocessor 71 updates the accumulated phase change since the start of the measurement.

Should the compensator measurement be interrupted for any reason, re-initialization would in general be required. However, with interpolation, the need to re-initialize can often be avoided. When a measurement interruption occurs, the last valid phase difference measurement before the interruption is used as a reference to determine the phase change during the interruption. If it can be assumed that the phase change was less than 180°, half a fringe, during the interruption, then both the magnitude and the direction of the change can be determined when phase measurement resumes. The validity of this assumption depends on the measurement bandwidth and the duration of the interruption. The measurement bandwidth for wavelength changes in air is typically very low. The expected duration for typical interruptions, such as beam blockage, electrostatic discharges, or electrical noise in the receiver, is small, from 1 microsecond to 1 or 2 seconds.

An interruption is characterized by a sharp phase change in the reference or measurement signal. This causes a large phase error signal at the output of phase discriminator 82 or 82'. A phase error signal above a certain threshold triggers a signal to microprocessor 71 indicating a signal error. When the phase error falls below the threshold, microprocessor 71 compares the next valid phase measurement to the last valid phase measurement. The comparison yields two possible results, a difference lower than 16 or a difference greater than 16. Using the result that is less than 16 counts, 180°, the microprocessor calculates the magnitude and direction of the change, and updates the accumulated phase change measurement. If the difference is equal to $\neq$counts, direction is indeterminate, and the microprocessor waits for a determinate result.

The use of the clock frequency at 32 times the reference frequency provides increased resolution in the phase measurement by interpolating between fringes. The resolution of the phase difference measurement can be increased by increasing the division factor of divider 88, to 64 or 128 for example. Increased resolution can be used in the compensation system to give more accurate compensation.

We claim:

1. Apparatus for compensating for changes in the wavelength of the laser light of a laser interferometer measurement system by measuring the apparent changes in the length of a stable physical length standard caused by changes in the refractive index of the ambient atmosphere, comprising:

an interferometer having an input for receiving a light beam and producing first and second output light beams for measuring the length differential between two surfaces that reflect the output beams, to produce a measure signal output representing the length differential;

means for directing the laser light beam of the laser interferometer measurement system to the input of the interferometer;

an optical cavity constructed of a very low thermal expansion material, having a front end with a first reflective surface and a rear end with a second reflective surface defining a substantially stable length between the two surfaces, with the space between the two surfaces open to the ambient atmosphere, the cavity being mounted to receive the output beams of the interferometer, so that the first reflective surface reflects the first output beam of the interferometer, and the second reflective surface reflects the second output beam of the interferometer;

means responsive to the measure signal from the interferometer and to a reference signal generated by the laser interferometer measurement system, for interpolating between interference fringes and producing a compensation signal representing the apparent change in the length of the optical cavity; and means responsive to the compensation signal for compensating the measurement of the laser interferometer measurement system.

2. The apparatus of claim 1 wherein the interferometer and the optical cavity are mounted on a baseplate, with the interferometer attached to the baseplate by a semi-kinematic mount capable of simultaneous adjustment in three rotational axes and the optical cavity attached to the baseplate by a temperature compensated mount that produces substantially no radial or axial stress on the optical cavity.

3. The apparatus of claim 2 wherein the semi-kinematic interferometer mount comprises:

a platform for holding the interferometer, having a spherical surface with a center coincident with the optical center of the interferometer;

a mounting hole in the baseplate formed by a first counterbore in one side of the baseplate and a second concentric counterbore in the other side of the baseplate, with an annular web between the counterbores, the web having a through hole at the center; and means for securing the platform to the baseplate through the hole in the web so that the spherical surface of the platform rests on the edge of the first counterbore.

4. The apparatus of claim 2 wherein the optical cavity is a cylinder of radius R(C), made of a material having a coefficient of thermal expansion TEC(C), and the temperature compensated mount for the optical cavity comprises:

a plurality of upright support plates, made of a material having a relatively low coefficient of thermal expansion TEC(P), mounted on the baseplate, each having an aperture of radius R(P), larger than R(C), for holding the optical cavity; and a plurality of linearly adjustable support means made of a material having a relatively high coefficient of thermal expansion TEC(S), mounted in the each of the support plates around the circumference of the aperture, for contacting the surface of the cavity, with the length of the linearly adjustable support means between the edge of the aperture and the surface of the cavity being $L(S)=R(P)-R(C)$; and the materials of the cavity, the support plate and the linearly adjustable support means, and the dimensions R(C) and R(P) are chosen such that, $TEC(C)*R(C)+TEC(S)*L(S)=TEC(P)*R(P)$.

5. The apparatus of claim 1 wherein the means for interpolating between interference fringes comprises:

a counter having a clock input, a start count input and a stop count input, and an enable input;

means for periodically applying a start count signal to the enable input of the counter to reset and enable the counter;

a phase locked loop responsive to the reference signal, for producing a first output signal with a frequency N times the frequency of the reference signal, and a second output at substantially the same phase and frequency as the reference signal, the first output signal applied to the clock input of the counter and the second output signal applied to the start input of the counter; and a phase locked loop responsive to the measure signal, for producing a third output at substantially the same phase and frequency as the measure signal, the third output signal applied to the stop input of the counter;

so that the count of the counter represents the phase difference between the reference signal and the measure signal;

and means responsive to the count of the counter for accumulating the phase difference measurements to determine the accumulated phase change.

6. A semi-kinematic mount for attaching an optical component to a baseplate, comprising:

a platform for holding the optical component, said platform having a spherical surface with a center coincident with the optical center of the optical component;

a mounting hole in the baseplate formed by a first counterbore in one side of the baseplate and a second concentric counterbore in the other side of the baseplate, with a deformable annular web between the counterbores, the web having a through hole at the center; and means for securing the platform to the baseplate through the hole in the web so that the spherical surface of the platform rests on the edge of the first counterbore.

* * * * *